United States Patent
Kim et al.

(10) Patent No.: US 7,973,475 B2
(45) Date of Patent: Jul. 5, 2011

(54) ORGANIC LIGHT EMITTING DISPLAY DEVICE AND METHOD FOR FABRICATING THE SAME

(75) Inventors: Dong Hwan Kim, Daegu-si (KR); Mi Youn Yang, Seoul (KR); Hyung Chul Kim, Seoul (KR); Jun Ho Lee, Gyeonggi-do (KR); Kyung Tak Oh, Daegu-si (KR)

(73) Assignee: LG Display Co., Ltd., Seoul (KR)

( * ) Notice: Subject to any disclaimer, the term of this patent is extended or adjusted under 35 U.S.C. 154(b) by 399 days.

(21) Appl. No.: 12/314,920

(22) Filed: Dec. 18, 2008

(65) Prior Publication Data
US 2009/0315450 A1 Dec. 24, 2009

(30) Foreign Application Priority Data
Jun. 24, 2008 (KR) .................. 10-2008-0059894

(51) Int. Cl.
*H01J 1/62* (2006.01)
*H01J 63/04* (2006.01)
(52) U.S. Cl. ............... 313/512; 313/504; 445/24
(58) Field of Classification Search ............ 313/512, 313/504; 445/24
See application file for complete search history.

(56) References Cited

U.S. PATENT DOCUMENTS

| | | | | |
|---|---|---|---|---|
| 6,911,773 | B2 * | 6/2005 | Seki | 313/506 |
| 6,963,169 | B2 * | 11/2005 | Peng | 313/506 |
| 7,633,223 | B2 * | 12/2009 | Yamazaki | 313/512 |
| 2010/0001633 | A1 * | 1/2010 | Lee et al. | 313/504 |

* cited by examiner

*Primary Examiner* — Nimeshkumar D Patel
*Assistant Examiner* — Glenn Zimmerman
(74) *Attorney, Agent, or Firm* — McKenna Long & Aldridge LLP

(57) ABSTRACT

An OLED device and a method for fabricating the same are disclosed, capable of improving yield and preventing decomposition of organic layers by moisture. An organic passivation layer having excellent morphology is applied to prevent a short circuit between an anode electrode and a cathode electrode. A Ca layer is applied to remove moisture from the inside of the device, thereby increasing the lifespan of the device. Accordingly, generation of dark sports by the short circuit caused by protrusions on a poor-morphology layer can be prevented. In addition, moisture absorbent layers are formed between the passivation layers and the partitions to remove outside moisture and the moisture outgassed from the inside, that is, partitions and organic layers, thereby elongating the lifespan of the OLED device.

12 Claims, 6 Drawing Sheets

ORGANIC LIGHT EMITTING DISPLAY DEVICE AND METHOD FOR FABRICATING THE SAME

This application claims the benefit of Korean Patent Application No. 10-2008-059894, filed on Jun. 24, 2008, which is hereby incorporated by reference for all purposes as if fully set forth herein.

BACKGROUND OF THE INVENTION

1. Field of the Invention

The present invention relates to an organic light emitting display (LED) device and a method for fabricating the same, and more particularly, to an organic LED device structured to prevent decomposition of organic layers caused by moisture, and a method for fabricating the same.

2. Discussion of the Related Art

With developments in the information-oriented society, demands for a new type of image displaying device to overcome shortcomings of the related art cathode ray tubes (CRT), such as its great weight and volume, have been increasing. In order to meet such demands, a variety of flat panel displays have been developed and spotlighted, including a liquid crystal display (LCD), an organic light emitting diode (OLED) display device, a plasma display panel (PDP) device, and a surface-conduction electron-emitter display (SED) device.

Among the above, the OLED device adopts an organic LED which is a self-emitting element that forms exciton through recombination of an electron and a hole, and generates light of a specific wavelength by energy from the exciton. Having excellent display properties such as a contrast ratio and a response time, and being efficient to implement a flexible display, the OLED device is considered as an ideal next-generation display device.

In general, the OLED is equipped with a cathode electrode for injecting the electron and an anode electrode for injecting the hole. The electron and the hole are injected into an emission layer respectively from the cathode electrode and the anode electrode. The OLED device emits light as the exiton formed by combination of the electron and the hole is turned from an excited state to a ground state.

Through such a principle, the OLED device does not require a dedicated light source, which is different from a related art thin film LCD device and therefore is capable of reducing the volume and the weight of the device. In addition, the OLED device achieves high-quality panel characteristics, that is, a low voltage, a high brightness, a fast response time and a low weight.

Owing to such advantageous characteristics, the OLED device is being applied to various portable digital devices including a mobile terminal, a car navigator system (CNS), a camcorder, and a digital camera, and further applied even to a TV screen. That is, the OLED device gaining popularity as the next-generation display device.

Moreover, the OLED device can considerably reduce fabricating costs compared to related art LCD devices since the fabricating process is relatively simple.

The OLED devices may be classified into a passive matrix type and an active matrix type based upon the driving method.

The passive matrix type OLED device is simply structured and fabricated. However, much power is consumed, and it is difficult to implement a large-area display. In addition, the numerical aperture (NA) is deteriorated as the number of lines increases.

On the other hand, the active matrix type OLED device is capable of supplying a high emission efficiency and a high image quality.

Figure 1:
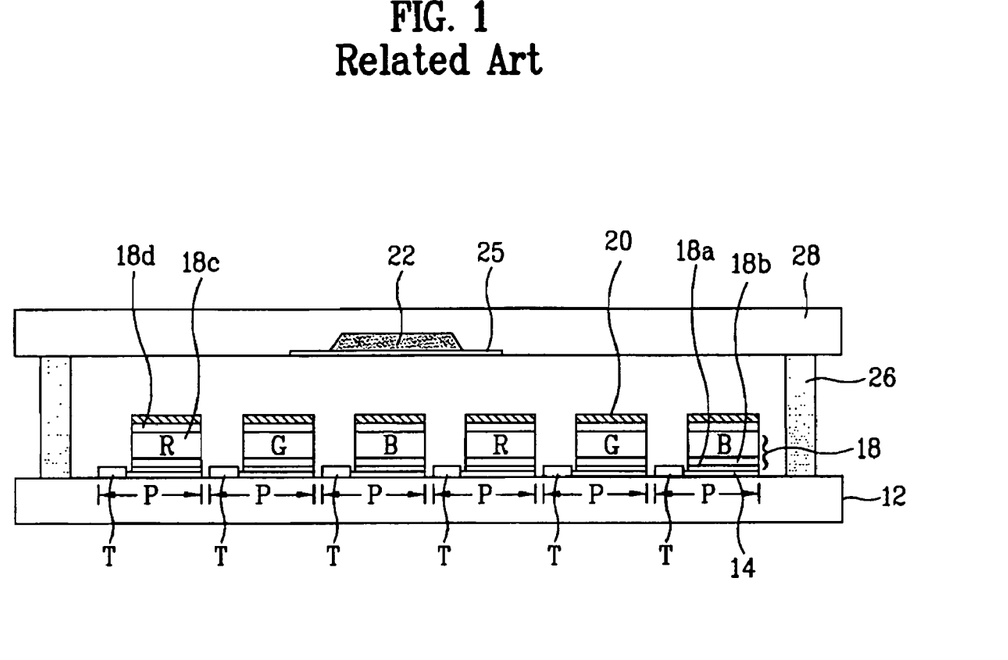
FIG. 1 schematically shows the structure of an active matrix type organic light emitting display (OLED) device according to a conventional art.
Figure 2:
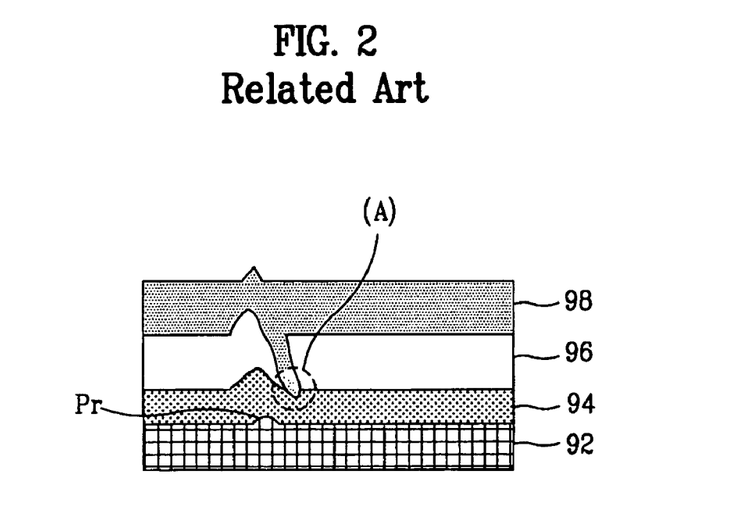
FIG. 2 explains a problem of a case where an inorganic passivation layer is applied in the related art OLED device.

FIG. 1 schematically shows the structure of an active matrix type OLED device including red, green and blue emission layers according to a related art. FIG. 2 explains a problem of a case where an inorganic passivation layer is applied in the related art OLED device.

As shown in FIG. 1, the OLED device 10 comprise a first substrate 12 having pixel regions P arranged in a matrix form, thin film transistors (TFT) T formed in each of the pixel regions P, first electrodes 14 electrically connected with the TFTs T provided in the respective pixel regions P, organic layers 18 formed at an upper part of the respective first electrodes 14, second electrodes 20 formed at an upper part of the respective organic layers 18, a second substrate 28 encapsulating and sealing an upper part of the first substrate 12 with a sealant 26, and a moisture absorbent 22 attached to the second substrate 28.

The organic layers 18 comprise organic emission layers 18c made of a dedicated organic material that emits red R, green G, and blue B lights.

In order to enhance the emission efficiency, a hole injection layer 18a and a hole transport layer 18b may be further provided. The injection layer 18a may be formed between the organic emission layer 18c and the first electrode 14, and the hole transport layer 18b may be formed between the organic emission layer 18c and the second electrode 20.

The moisture absorbent 22 prevents entry of moisture to the inside. The second substrate 28 is partly etched and the moisture absorbent 22 in a powder form is attached to the etched portion and fixed by an adhesive tape 25.

Additionally, although not shown, a partition may be further provided to prevent interference between adjoining pixel regions.

As described above, an organic light emitting display (OLED) device comprises thin film transistors (TFTs) for driving respective pixel regions, and the TFTs are electrically insulated from other layers by a passivation layer formed on the whole surface of a substrate including the TFTs.

Generally, the passivation layer comprises an inorganic insulating material such as SiNx or SiOy, being formed through a chemical vaporized deposition (CVD).

Such a passivation layer 92 formed of the inorganic insulating material, however, has a morphologically uneven surface, thereby partially generating protrusions Pr as shown in FIG. 2.

When the protrusions Pr are generated, an anode electrode 94, an organic emission layer 96, and a cathode electrode 98 deposited on the upper part of the protrusions Pr are influenced in sequence. Accordingly, a short circuit may be caused between the anode electrode 94 and the cathode electrode 98 as shown by a part A in FIG. 2.

Thus, the short circuit part of the anode electrode 94 and the cathode electrode 98 is indicated by dark spots in the drawing.

In the OLED device, additionally, various layers including the organic emission layer are formed of organic materials. Such organic layers are subject to decomposition due to moisture from the outside and moisture outgassed from the inside. Therefore, it is difficult to guarantee a sufficient lifespan of the device as a display device.

To this end, a technology that removes the moisture existing in the encapsulated inside is required as an essential factor for commercializing the OLED device.

SUMMARY OF THE INVENTION

Accordingly, the present invention is directed to an organic light emitting display (LED) device and a method for fabricating the same that substantially obviates one or more problems due to limitations and disadvantages of the related art.

An advantage of the present invention is to provide an organic LED device capable of preventing a short circuit between an anode electrode and a cathode electrode using an organic passivation layer having favorable morphology, and improving the lifespan thereof by removing moisture inside the OLED device by forming a calcium (Ca) layer, and a method for fabricating the same.

Additional advantages, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, an OLED device comprises a substrate divided into pixel regions and non-pixel regions, thin film transistors (TFT) on the substrate, an organic passivation layer on an entire surface of the substrate including the TFTs, first electrodes on the organic passivation layer of the pixel regions to connect to the respective TFTs, organic emission layers on the respective first electrodes, a second electrode on an entire surface of the substrate including the organic emission layers, partitions on the organic passivation layer in the non-pixel regions to define the respective pixel regions, and first moisture absorbent layers between the respective partitions and the organic passivation layer.

The OLED device may further comprise a second moisture absorbent layer on the second electrode.

In another aspect of the present invention, a method for fabricating an OLED device comprises; preparing a substrate divided into pixel regions and non-pixel regions; forming thin film transistors on the substrate; forming an organic passivation layer on an entire surface of the substrate including the thin film transistors; forming contact holes in the organic passivation layer to expose drain electrodes of the thin film transistors; forming first electrodes on the organic passivation layer of the pixel regions to contact to the drain electrodes through the contact holes; forming first moisture absorbent layers on the organic passivation layer of the non-pixel regions; forming partitions in the non-pixel regions to cover the first moisture absorbent layers; forming organic emission layers on the first electrodes; and forming a second electrode on the an entire surface of the substrate including the organic emission layers.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and along with the description serve to explain the principle of the invention. In the drawings.

DETAILED DESCRIPTION OF THE INVENTION

Reference will now be made in detail to embodiments of the present invention, examples of which are illustrated in the accompanying drawings. Wherever possible, the same reference numbers will be used throughout the drawings to refer to the same or like parts.

Figure 3:
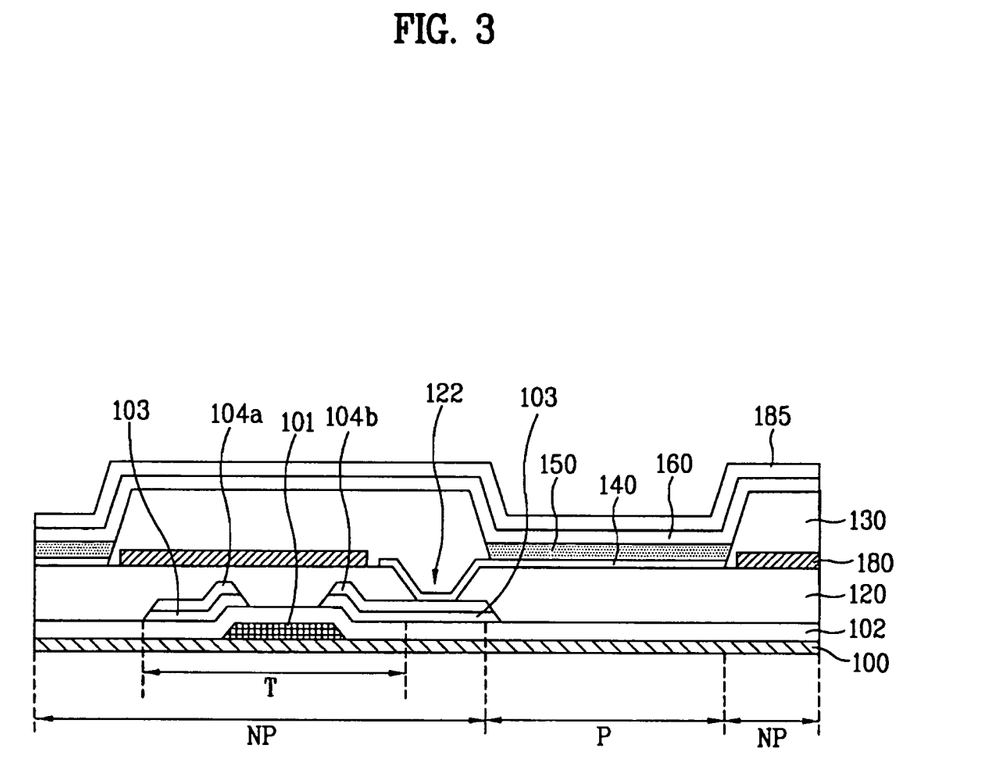
FIG. 3 is a sectional view of an OLED device according to an embodiment of the present invention.

FIG. 3 is a sectional view of an organic light emitting display (OLED) device according to an embodiment of the present invention.

Referring to FIG. 3, the OLED device according to this embodiment comprises a substrate 100 in which a plurality of pixel regions P are arranged in a matrix form and non-pixel regions NP are arranged in the part excluding the pixel regions are defined, partitions 130 formed in the non-pixel regions NP to define the respective pixel regions P, thin film transistors (TFT) T formed on the substrate 100 to drive pixels, an organic passivation layer 120 of an organic material covering the whole surface of the substrate 100 including the TFTs T, first electrodes 140 connected to the TFTs T through contact holes 122 formed by partly removing the organic passivation layer 120 to expose drain electrodes of the TFTs, organic emission layers 150 formed on the respective first electrodes 140, a second electrode 160 formed on the whole surface of the substrate 100 including the organic emission layers 150, and first moisture absorbent layers 180 formed between the respective partitions 130 and the organic passivation layer 120.

The partition 130 covers the first moisture absorbent layer 180 so that the first moisture absorbent layer 180 and the first electrode 140 are electrically insulated from each other.

The substrate 100 may be made of a transparent material such as glass. When embodying a flexible display, a flexible plastic material such as polyethylene terephthalate (PET) may be applied.

In the substrate 100, the pixel regions P are formed in the matrix arrangement and the non-pixel regions NP are formed on the part excluding the pixel regions P.

The TFTs T are formed in the respective pixel regions P to drive the pixels.

For example, the TFT T may comprise a gate electrode 101 formed on the substrate 100, a gate dielectric layer 102 formed on an entire surface of the substrate 100 including the gate electrode 101, a semiconductor layer 103 formed on the gate dielectric layer 102 above the gate electrode 101, a source electrode 104a and a drain electrode 104b formed on the semiconductor layer 103 at an interval from each other with a channel region disposed therebetween.

The organic passivation layer 120 is formed on an entire surface of the substrate 100 including the TFTs T. The organic passivation layer 120 is partly removed to form the contact hole 122 exposing the drain electrode 104b.

The organic passivation layer 120 may be made of an organic insulating material, especially a high molecular organic insulating material having the molecular weight of greater than 10,000. Such an organic insulating material is characterized in an excellent morphology compared to inorganic insulating materials.

When using the high molecular organic insulating material, especially, the organic passivation layer 120 is made by applying a liquid organic material onto the substrate 100 and baking the organic material. The contact hole 122 may be formed by patterning the baked organic material. Thus, using the liquid organic material, the organic passivation layer 120 having excellent morphology can be obtained.

In addition, as shown in FIG. 3, the organic passivation layer 120 applied in the liquid state and baked is able to serve as a planarization layer which helps the first electrode 140, the organic emission layer 150 and the second electrode 160 to be planarly formed on the pixel region P.

The first electrode 140 may comprise an anode electrode and is connected to the drain electrode 104b through the contact hole 122. Additionally, for example, the first electrode 140 may be formed of metal having transparency and a high work function, such as indium tin oxide (ITO).

The organic emission layer 150 is formed between the first electrode 140 and the second electrode 160 that will be explained later. The organic emission layer 150 emits light using holes and electrons supplied from the first and the second electrodes 140 and 160.

The second electrode 160 may comprise a cathode electrode, being formed on an entire surface of the substrate 100 including the organic emission layer 150. In addition, for example, the second electrode 160 may be formed of an opaque metal having a low work function but a high reflectivity, such as aluminum.

Although not shown, organic layers may be further provided between the organic emission layer 150 and the first electrode 140 or between the organic emission layer 150 and the second electrode 160, so as to improve the emission efficiency.

For example, when the first electrode 140 is an anode electrode, a hole injection layer or a hole transport layer may be additionally formed between the organic emission layer 150 and the first electrode 140. When the second electrode 160 is a cathode electrode, an electron transport layer or an electron injection layer may be additionally formed between the organic emission layer 150 and the second electrode 160. Those organic layers are formed on the whole surface of the substrate 100.

The first moisture absorbent layer 180 is formed in the non-pixel region NP disposed between the respective pixel regions P, and may be formed of a hygroscopic material such as calcium (Ca).

The partition 130 is formed in the non-pixel region NP disposed between respective first electrodes 140 formed in the pixel regions P, thereby separating the respective the pixel regions P. The partition 130 is formed of an organic insulating material to cover the first moisture absorbent layer 180, thereby insulating the first moisture absorbent layer 180 and the first electrode 140 from each other.

Thus, since the partition 130 comprising the organic insulating material covers the first moisture absorbent layer 180, the first electrodes 140 formed in the respective adjoining pixel regions P can be electrically insulated.

A second moisture absorbent layer 185 may be further formed on an entire surface of the substrate 100 including the second electrode 160. Here, the second moisture absorbent layer 185 may also be formed as a Ca layer.

By thus forming the second moisture absorbent layer 185 additionally on the upper part of the partition 130, moisture entering from the outside can be more effectively removed.

As described above, the OLED device according to the embodiment includes the organic passivation layer 120 having an excellent morphology property and therefore is capable of preventing generation of protrusions at an upper part of the passivation layer 120.

Furthermore, according to the embodiment of the present invention, since the first moisture absorbent layer 180 is formed between the organic passivation layer 120 and the partition 130, not only the moisture from the outside but also moisture from the organic passivation layer 120 and the partition 130 can be more effectively removed.

Moreover, since the partition 130 electrically insulates the first moisture absorbent layer 180 and the first electrode 140 from each other by covering the first moisture absorbent layer 180, the first electrodes 140 formed in the pixel regions P can be insulated even though the first moisture absorbent layer 180 is formed by a Ca layer.

Hereinafter, an OLED device according to another embodiment of the present invention will be described.

Figure 4:
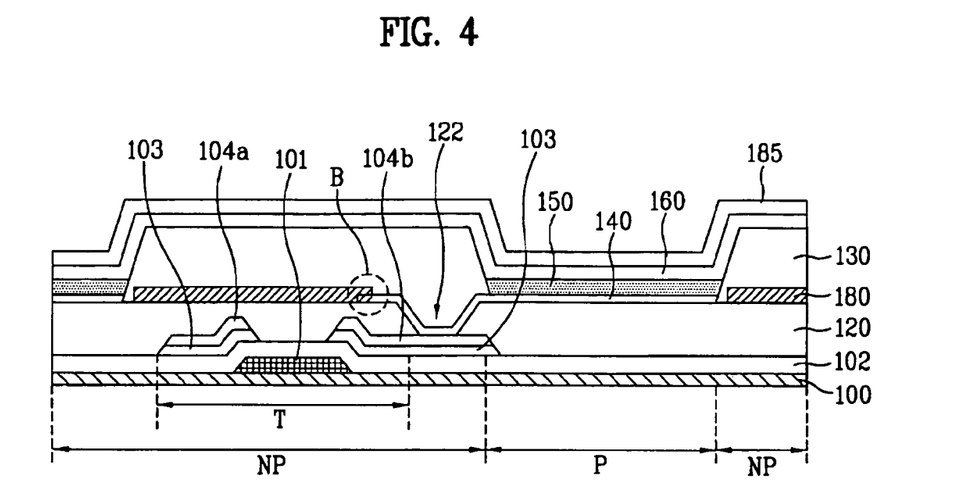
FIG. 4 is a sectional view of an OLED device according to another embodiment of the present invention.

FIG. 4 is a sectional view of the OLED device according to another embodiment.

Referring to FIG. 4, the OLED device comprises the substrate 100 divided into the pixel regions P arranged in the matrix form and the non-pixel regions NP formed in the part excluding the pixel regions P, the partitions 130 formed in the non-pixel regions NP so as to define the respective pixel regions P, the TFTs T formed on the substrate 100 to drive the pixels, the organic passivation layer 120 formed of an organic material, covering the whole surface of the substrate 100 including the TFTs T, the first electrodes 140 connected to the TFTs T through the contact holes 122 formed by partially removing the organic passivation layer 120 to partly expose the TFTs, the organic emission layers 150 formed on the respective first electrodes 140, a second electrode 160 formed on the whole surface of the substrate 100 including the organic emission layers 150, and the first moisture absorbent layers 180 formed between the respective partitions 130 and the organic passivation layer 120.

The partition 130 is formed to cover the first moisture absorbent layer 180, thereby insulating the first moisture absorbent layer 180 from the first electrode 140.

The first moisture absorbent layer 180 is overlapped with the first electrode 140 of the pixel region P by an overlapping area B, while being insulated from the first electrode 140 and the first moisture absorbent layer 180 formed in the adjoining pixel region P.

That is, one side of the first moisture absorbent layer 180 is connected to the first electrode 140 whereas the other side is covered with the partition 130.

Accordingly, the first moisture absorbent layer 180 and the first electrode 140 formed in the pixel region P are insulated electrically from the first moisture absorbent layer 180 and the first electrode 140 of the adjoining pixel region P by the partition 130.

The substrate 100 may be formed of a transparent material such as glass, or a flexible plastic such as PET when applied to a flexible display device.

In the substrate 100, the pixel regions P are in the matrix arrangement and the non-pixel regions NP are formed on the area excluding the pixel regions P.

The TFTs T are formed in the respective pixel regions P to drive the pixels.

For example, the TFT T may comprise the gate electrode 101 formed on the substrate 100, the gate dielectric layer 102 covering the gate electrode 101, the semiconductor layer 103 formed on the gate dielectric layer 102, the source electrode 104a and the drain electrode 104b formed on the semiconductor layer 103 at an interval from each other with a channel region disposed therebetween.

The organic passivation layer 120 is formed on the whole surface of the substrate 100 including the TFTs T. The organic passivation layer 120 is partly removed to form the contact hole 122 exposing the drain electrode 104b.

The organic passivation layer 120 may be made of an organic insulating material, especially a high molecular organic insulating material having the molecular weight of greater than 10,000. Such an organic insulating material is characterized in an excellent morphology compared to inorganic insulating materials.

When using the high molecular organic insulating material, the organic passivation layer 120 is made by applying a liquid organic material onto the substrate 100 and baking the organic material. The contact hole 122 may be formed by patterning the baked organic material. Thus, using the liquid organic material, the organic passivation layer 120 having excellent morphology can be obtained.

In addition, as shown in FIG. 4, the organic passivation layer 120 applied in the liquid state and baked is able to serve as a planarization layer which helps the first electrodes 140, the organic emission layers 150 and the second electrode 160 to be planarly formed on the pixel region P.

The first electrode 140 may comprise an anode electrode and is connected to the drain electrode 104b through the contact hole 122. Additionally, for example, the first electrode 140 may be formed of metal having transparency and a high work function, such as indium tin oxide (ITO).

The organic emission layer 150 is formed between the first electrode 140 and the second electrode 160 that will be explained later. The organic emission layer 150 emits light using holes and electrons supplied from the first and the second electrodes 140 and 160.

The second electrode 160 may comprise a cathode electrode, being formed on the whole surface of the electrode 100 which includes the organic emission layer 150. In addition, for example, the second electrode 160 may be formed of an opaque metal having a low work function but a high reflectivity, such as aluminum.

Although not shown, organic layers may be further provided between the organic emission layer 150 and the first electrode 140 or between the organic emission layer 150 and the second electrode 160, so as to improve the emission efficiency.

For example, when the first electrode 140 is an anode electrode, the hole injection layer or the hole transport layer may be additionally formed between the organic emission layer 150 and the first electrode 140. When the second electrode 160 is a cathode electrode, the electron transport layer or the electron injection layer may be additionally formed between the organic emission layer 150 and the second electrode 160. Those organic layers are formed on the whole surface of the substrate 100.

The first moisture absorbent layer 180 is formed in the non-pixel region NP disposed between the respective pixel regions P, and may be formed of a hygroscopic material such as calcium (Ca). In addition, one side of the first moisture absorbent layer 180 is connected to the first electrode 140.

The partition 130 is formed of an organic insulating material and in the non-pixel region NP disposed between respective first electrodes 140 formed in the pixel regions P, so as to separate the respective pixel regions P. The partition 130 covers the first moisture absorbent layer 180 and the overlapping area B where the first moisture absorbent layer 180 and the first electrode 140 are overlapped.

Since the partition 130 formed of the organic insulating material covers one side of the first moisture absorbent layer 180 in connection with the first electrode 140, the first moisture absorbent layer 180 and the first electrode 140 can be electrically insulated from the first moisture absorbent layer 180 and the first electrode 140 of the adjoining pixel region P.

Thus, since the partitions 130 comprising the organic insulating material covers the first moisture absorbent layers 180, the first electrodes 140 formed in the respective adjoining pixel regions P can be electrically insulated.

A second moisture absorbent layer 185 may be further formed on the whole surface of the substrate 100 which includes the partitions 130 and the second electrode 160. Here, the second moisture absorbent layer 185 may also be formed as a Ca layer.

By additionally forming the second moisture absorbent layer 185 covering the whole surface of the substrate 100 including the partition 130 and the second electrode 160, moisture entering from the outside can be more effectively removed.

Also, the second moisture absorbent layer 185 may be selectively disposed only on the upper parts of the partitions 130 or the upper part of the second electrode 160.

As described above, the OLED device according to the another embodiment includes the organic passivation layer 120 having an excellent morphology property and therefore is capable of preventing generation of protrusions at an upper part of the passivation layer 120.

Furthermore, according to the another embodiment of the present invention, since the first moisture absorbent layer 180 is formed between the organic passivation layer 120 and the partition 130, not only the moisture from the outside but also moisture outgassed from the organic passivation layer 120 and the partition 130 can be more effectively removed.

Moreover, when being formed of metal, for example Ca, the first moisture absorbent layer 180 connected to the first electrode 140 is capable of reducing resistance of the first electrode 140.

Hereinafter, a method for fabricating the OLED device according to the embodiments of the present invention will be described in detail.

FIG. 5A through FIG. 5E are sectional views illustrating the fabricating processes of the OLED device.

Figure 5A:
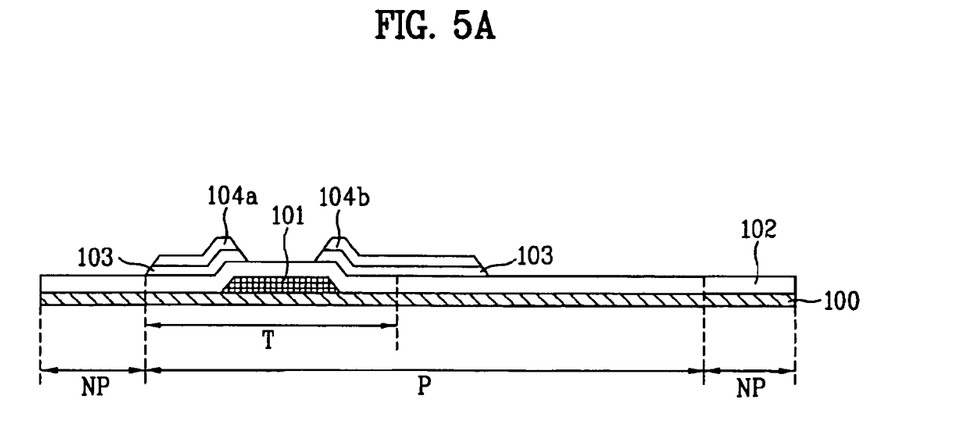
FIG. 5A to FIG. 5E are sectional views illustrating the fabricating processes of the OLED device.

First, referring to FIG. 5A, the TFTs T to drive the pixels are formed on the substrate 100 wherein the pixel regions P and the non-pixel regions NP are defined. The TFTs T are formed on the pixel regions P.

Here, the substrate 100 may be formed of a transparent material such as glass, or a flexible plastic such as PET when applied to a flexible display device.

The TFT T comprises the gate electrode 101 formed on the substrate 100, the gate dielectric layer 102 formed on an entire surface of the substrate 100 including the gate electrode 101, the semiconductor layer 103 formed on the gate dielectric layer 102 above the gate electrode 101, the source electrode 104a and the drain electrode 104b formed on the semiconductor layer 103 at an interval from each other with a channel region disposed therebetween.

Although not shown, the gate electrode 101 is diverged from a gate line formed on the substrate 100. The source electrode 104a is diverged from a data line arranged across the gate line with a gate dielectric layer interposed.

The semiconductor layer may be formed of amorphous silicon and may additionally comprise an ohmic contact layer disposed between the source and drain electrodes 104a and 104b and the semiconductor layer.

Figure 5B:
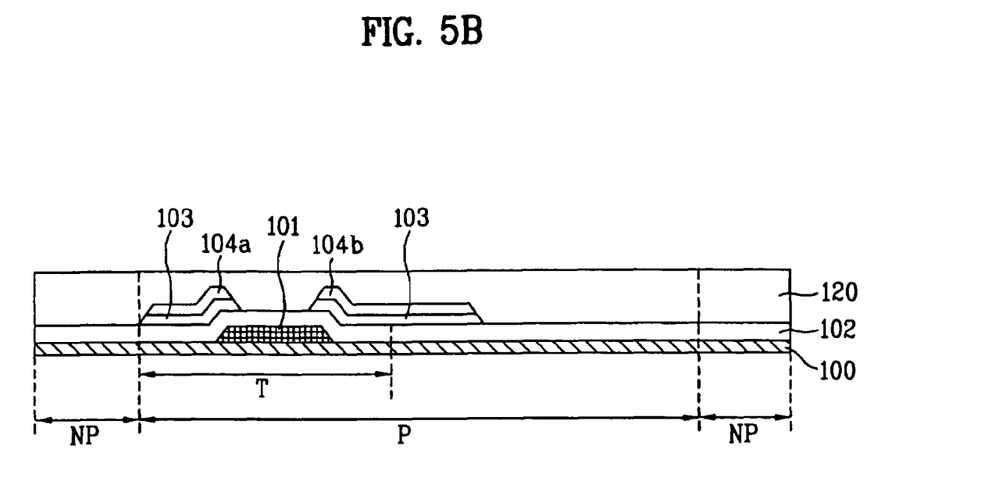

As shown in FIG. 5B, next, the organic passivation layer 120 is formed on an entire surface of the substrate 100 including the TFTs T.

For example, after applying a high-molecular liquid organic passivation material on the substrate 100 including the TFTs T, the applied organic passivation material is baked, accordingly obtaining the organic passivation layer.

Here, the organic passivation layer may comprise poly vinyl phenol (PVP), Benzo Cyclo Butene (BCB), Poly Methyl Methacrylate (PMMA), and polyimide.

Since being made of the high molecular liquid, the organic passivation layer 120 may serve as a planarization layer which planarizes the first electrodes 140, the organic emission layers 150, and the second electrode 160 which are formed in the pixel region P.

Figure 5C:
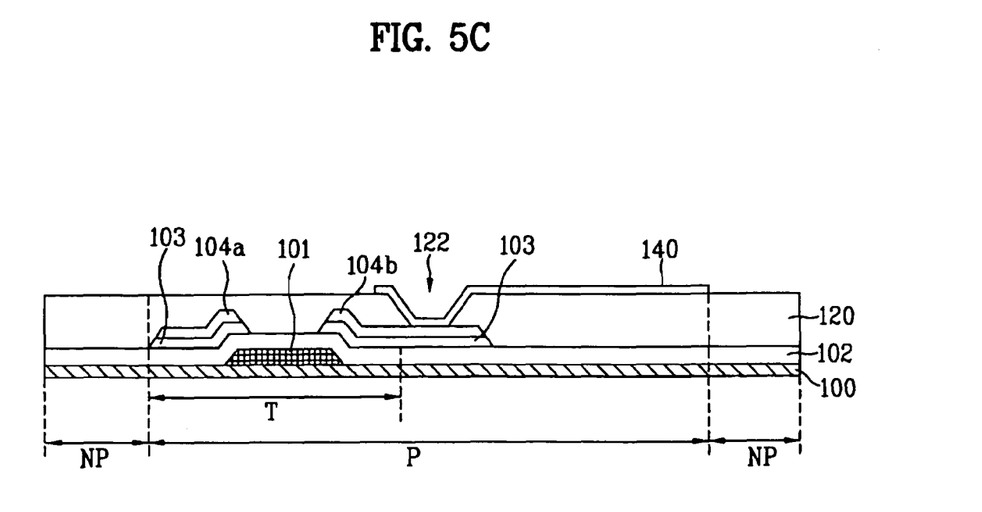

After the organic passivation layer 120 is formed, as shown in FIG. 5C, the organic passivation layer 120 is selectively patterned, thereby forming contact holes 122 that expose the drain electrode 104b of the TFT. The organic passivation layer 120 may be patterned by photolithography.

Figure 5D:
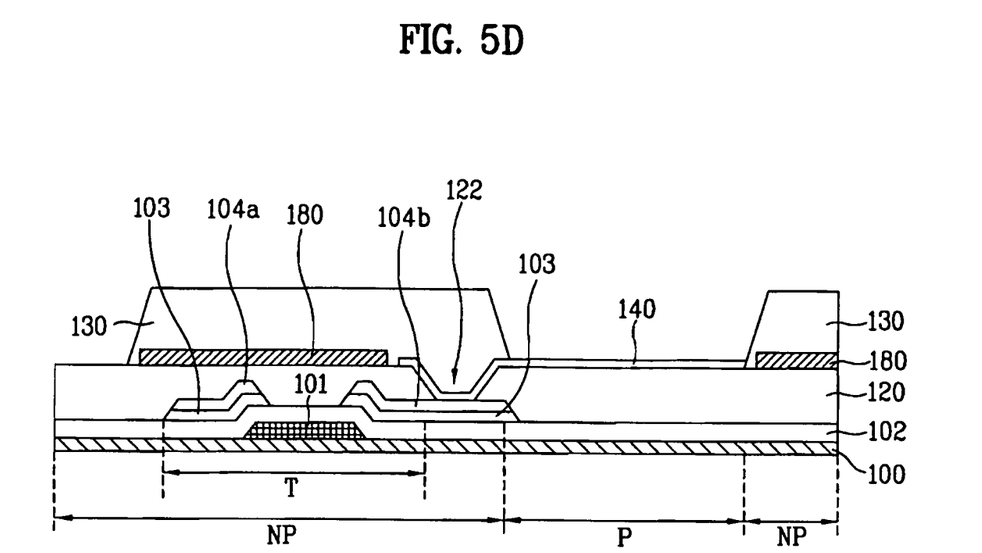

Next, as shown in FIG. 5D, the first electrode 140 is formed in each of the pixel regions P, to be connected to the drain electrode 104b of the TFT T through the contact hole 122.

The first electrode 140 may be formed by vapor-depositing, for example by sputtering, and patterning a transparent metal having a high work function, such as ITO. According to an exemplary embodiment, a shadow mask may be used to selectively perform the vapor-deposition.

After forming the first electrode 140, the first moisture absorbent layer 180 is formed in the non-pixel region NP. A hygroscopic material such as Ca may be used for the first moisture absorbent layer 180.

The first moisture absorbent layer 180 may be formed through vacuum evaporation, for example, heat evaporation. Photolithography may also be applied in forming the first moisture absorbent layer 180.

The vacuum evaporation used for forming a thin film on a substrate refers to a method of coating an even surface of an object by evaporating a coating material under vacuum. According to this, patterns can be selectively formed on the substrate 100 using the shadow mask.

Then, the partition 130 comprising the organic insulating material is formed on the upper part of the first moisture absorbent layer 180. The partition 130 may be formed by the vacuum evaporation, or by applying a photoresist and then patterning the photoresist by the photolithography.

As aforementioned, the partition 130 separately defines the respective non-pixel regions NP by being disposed among the pixel regions P. In addition, the partition 130 covers the first moisture absorbent layer 180 so that the first moisture absorbent layer 180 is insulated from the first electrode 140.

Figure 5E:
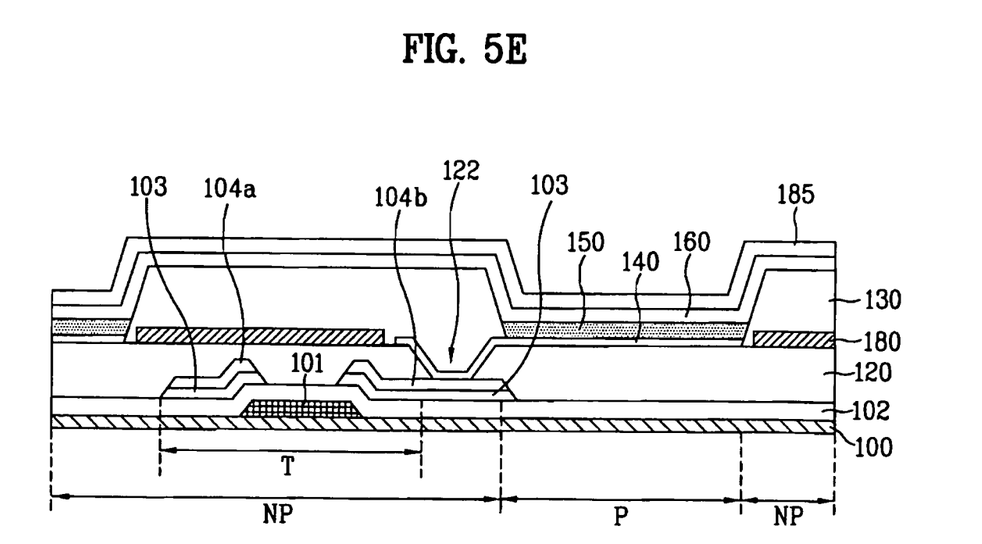

Next, as shown in FIG. 5E, the organic emission layer 150 is formed on the first electrode 140 by selectively performing the vapor deposition, and the second electrode 160 and the second moisture absorbent layer 185 are vapor-deposited on the whole surface of the substrate 100 including the organic emission layer 150.

Although not shown, organic layers may be additionally formed between the organic emission layer 150 and the first electrode 140 or between the organic emission layer 150 and the second electrode 160, in order to improve the emission efficiency.

For example, when the first electrode 140 is an anode electrode, the hole injection layer or the hole transport layer may be additionally formed between the organic emission layer 150 and the first electrode 140. When the second electrode 160 is a cathode electrode, the electron transport layer or the electron injection layer may be additionally formed between the organic emission layer 150 and the second electrode 160.

The organic emission layer 150, the hole injection layer, the hole transport layer, the electron injection layer, the electron transport layer, and the second electrode 160 are formed on the whole surface of the substrate 100 also by the vacuum evaporation.

After one side of the first moisture absorbent layer 180 is connected to the first electrode 140, the partition 130 may be formed to cover the other side of the first moisture absorbent layer 180. In this case, the partition 130 and the first electrode 140 may be partly overlapped.

As described above, in accordance with the fabricating method of the OLED device according to the embodiment of the present invention, dark spots are reduced by using the liquid organic passivation layer having the excellent morphology property, thereby decreasing the inferiority rate. Also, the processing efficiency can be improved by using the high molecular organic material.

Figure 6:
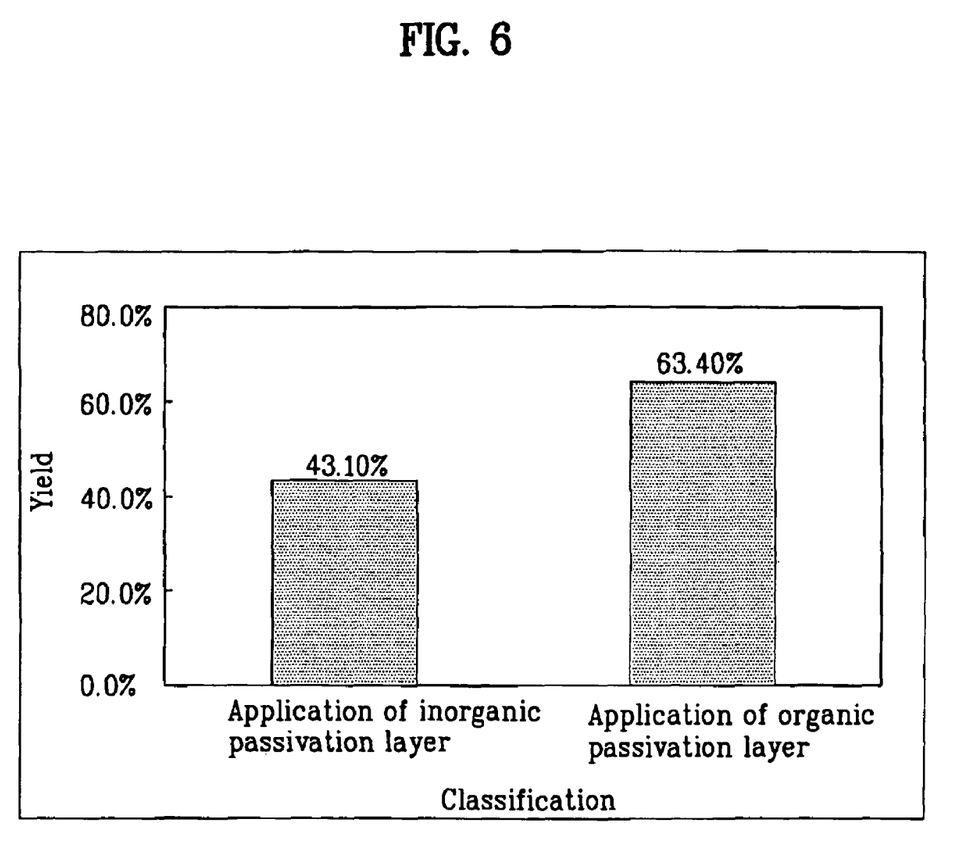
FIG. 6 is a graph comparatively showing the yield of the OLED device applying an organic passivation layer according to the embodiments of the present invention and the yield of an OLED device applying a conventional inorganic passivation layer.

FIG. 6 is a graph comparing the yield of the OLED device applying an organic passivation layer according to the embodiments of the present invention and the yield of an OLED device applying a conventional inorganic passivation layer. Referring to FIG. 6, the yield is 43.1% when applying the inorganic passivation layer whereas the yield is 63.4% when applying the organic passivation layer. That is, the yield is increased by about 20.3%.

Furthermore, by providing the moisture absorbent layer 180 between the partition 130 and the organic passivation layer 120, moisture from the outside and moisture outgassed from several internal layers, especially from the partitions 130 and the organic passivation layers 120, can be effectively removed. As a result, the lifespan of the OLED device can be improved.

As apparent from the above description, in accordance with the OLED device and a method for fabricating the same according to any one of the above-described embodiments of the present invention, a short circuit between an anode electrode and a cathode electrode by inferior morphology can be prevented by applying an organic passivation layer. As a result, generation of dark spots can be prevented.

In addition, since a moisture absorbent layer is formed between the organic passivation layer and a partition, moisture getting in from the outside and moisture outgassed from the partition and the organic layer can be effectively absorbed, thereby improving the lifespan of the OLED.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic light emitting display (OLED) device comprising:
   a substrate divided into a plurality of pixel regions and a plurality of non-pixel regions excluding the pixel regions;
   thin film transistors (TFT) on the substrate to drive respective pixel regions;
   an organic passivation layer on an entire surface of the substrate including the TFTs;

first electrodes on the organic passivation layer to connect to the respective TFTs;
partitions on the organic passivation layer in the non-pixel regions to define the respective pixel regions;
organic emission layers formed on the respective first electrodes;
a second electrode on an entire surface of the substrate including the organic emission layers; and
first moisture absorbent layers formed between the respective partitions and the organic passivation layer.

2. The OLED device according to claim 1, further comprising a second moisture absorbent layer on the second electrode.

3. The OLED device according to claim 2, wherein the second moisture absorbent layer comprises Ca.

4. The OLED device according to claim 1, wherein the first moisture absorbent layer comprises Ca.

5. The OLED device according to claim 1, wherein the first moisture absorbent layer is at an interval from the first electrode.

6. The OLED device according to claim 1, wherein the first moisture absorbent layer is partly overlapped with the first electrode.

7. A method for fabricating an OLED device comprising:
preparing a substrate divided into pixel regions and non-pixel regions;
forming thin film transistors on the substrate;
forming an organic passivation layer on an entire surface of the substrate including the thin film transistors;
forming contact holes in the organic passivation layer to expose drain electrodes of the thin film transistors;
forming first electrodes on the organic passivation layer of the pixel regions to contact the drain electrodes through the contact holes;
forming first moisture absorbent layers on the organic passivation layer of the non-pixel regions;
forming partitions in the non-pixel regions to cover the first moisture absorbent layers;
forming organic emission layers on the first electrodes; and
forming a second electrode on the an entire surface of the substrate including the organic emission layers.

8. The fabricating method according to claim 7, further comprising forming a second moisture absorbent layer on the second electrode.

9. The fabricating method according to claim 8, wherein the second moisture absorbent layer comprises Ca.

10. The fabricating method according to claim 7, wherein the first moisture absorbent layer comprises Ca.

11. The fabricating method according to claim 7, wherein the first moisture absorbent layer is at an interval from the first electrode.

12. The fabricating method according to claim 7, wherein the first moisture absorbent layer is partially overlapped with the first electrode.

* * * * *